(12) United States Patent
Schacht

(10) Patent No.: US 11,614,473 B2
(45) Date of Patent: Mar. 28, 2023

(54) SYSTEM AND METHOD FOR MONITORING POWER CONSUMPTION OF AN APPLIANCE

(71) Applicant: Hubbell Incorporated, Shelton, CT (US)

(72) Inventor: Derek Hudson Schacht, Ledyard, CT (US)

(73) Assignee: Hubbell Incorporated, Shelton, CT (US)

( * ) Notice: Subject to any disclaimer, the term of this patent is extended or adjusted under 35 U.S.C. 154(b) by 74 days.

(21) Appl. No.: 17/212,447

(22) Filed: Mar. 25, 2021

(65) Prior Publication Data

US 2021/0302479 A1 Sep. 30, 2021

Related U.S. Application Data

(60) Provisional application No. 62/994,423, filed on Mar. 25, 2020.

(51) Int. Cl.
*G01R 19/25* (2006.01)
*G01R 21/133* (2006.01)
*G01D 4/00* (2006.01)

(52) U.S. Cl.
CPC ......... *G01R 19/2513* (2013.01); *G01D 4/004* (2013.01); *G01R 21/133* (2013.01)

(58) Field of Classification Search
CPC .................................................. G01R 19/2513
USPC ........................................................ 702/61
See application file for complete search history.

(56) References Cited

U.S. PATENT DOCUMENTS

| 8,649,987 | B2 * | 2/2014 | Steenberg .......... G05B 23/0235 702/61 |
| 2009/0292403 | A1 | 11/2009 | Howell et al. |
| 2010/0082172 | A1 | 4/2010 | Ko et al. |
| 2013/0083193 | A1 * | 4/2013 | Okuyama .............. G08C 17/02 348/143 |
| 2013/0096857 | A1 * | 4/2013 | Chakradhar ........... G01D 4/002 324/142 |
| 2014/0125150 | A1 | 5/2014 | Alberth, Jr. et al. |
| 2014/0129160 | A1 * | 5/2014 | Tran ..................... G01R 21/007 702/61 |

(Continued)

OTHER PUBLICATIONS

PCT/US2021/024120 International Search Report and Written Opinion dated Jun. 23, 2021(10 pages).

*Primary Examiner* — Ricky Go
(74) *Attorney, Agent, or Firm* — Robinson & Cole LLP

(57) ABSTRACT

A method for monitoring power consumption of an appliance within a space is provided. The method includes obtaining a first set of data indicative of power consumption of the appliance during an interval of time and determining a profile indicative of power consumption of the appliance based, at least in part, on the first set of data. The method includes obtaining a second set of data indicative of power consumption of the appliance subsequent to obtaining the first set of data. The method includes determining whether power consumption of the appliance deviates from the profile based, at least in part, on the second set of data. Furthermore, in response to determining power consumption of the appliance deviates from the profile, the method includes providing a notification indicative of power consumption of the appliance deviating from the profile.

18 Claims, 7 Drawing Sheets

(56) References Cited

U.S. PATENT DOCUMENTS

| | | | |
|---|---|---|---|
| 2015/0032277 A1* | 1/2015 | Warren | G05B 15/02 |
| | | | 463/36 |
| 2015/0137970 A1* | 5/2015 | Davis | G08B 21/0484 |
| | | | 340/521 |
| 2015/0177292 A1* | 6/2015 | Silveira Filho | G01R 19/2513 |
| | | | 702/60 |
| 2016/0034813 A1* | 2/2016 | Hsu | G06N 3/02 |
| | | | 706/46 |
| 2016/0077139 A1* | 3/2016 | Gonzales, Jr. | G01R 21/133 |
| | | | 702/61 |
| 2016/0358443 A1* | 12/2016 | True | G08B 25/08 |

* cited by examiner

SYSTEM AND METHOD FOR MONITORING POWER CONSUMPTION OF AN APPLIANCE

RELATED APPLICATIONS

This application claims the benefit of U.S. Provisional Patent Application No. 62/994,423, filed Mar. 25, 2020, the entire content of which is hereby incorporated by reference.

FIELD

The present disclosure relates generally to a system and method for monitoring operation (e.g. power consumption) of an appliance located within a space.

SUMMARY

In-wall devices may include devices that may be mounted on or at least partially disposed within a wall or other surface (e.g., in a wall mounted electrical box). Example in-wall devices may include power switches used to control various powered devices, such as electronics, light sources, appliances, power outlets, and/or other devices. Power switches may control power delivered to a load, for instance, by interrupting a conductor delivering power to a load. Example power switches may include, for instance, single or multiple on/off toggle switches, paddle or rocker switches, single or multiple pole dimmer switches, power outlets, etc.

In some instances, power switches and other in-wall devices communicate with other electronic devices over one or more communication links. For instance, power switches may be capable of communicating using communication technologies, such as Bluetooth low energy, Bluetooth mesh networking, near-field communication, Wi-Fi, Zigbee, Ethernet, etc.

Aspects and advantages of embodiments of the present disclosure will be set forth in part in the following description, or may be learned from the description, or may be learned through practice of the embodiments.

In one aspect, the present disclosure provides a method for monitoring power consumption of an appliance within a space. The method includes obtaining a first set of data indicative of power consumption of the appliance during an interval of time and determining a profile indicative of power consumption of the appliance based, at least in part, on the first set of data. The method includes obtaining a second set of data indicative of power consumption of the appliance subsequent to obtaining the first set of data. The method includes determining whether power consumption of the appliance deviates from the profile based, at least in part, on the second set of data. Furthermore, in response to determining power consumption of the appliance deviates from the profile, the method includes providing a notification indicative of power consumption of the appliance deviating from the profile.

In another aspect, the present disclosure provides a system for monitoring operation of an appliance within a space. The system includes a power switch configured to control power delivery to one or more electrical loads within a space, the power switch comprising one or more microphones. The system further includes an electrical outlet configured to couple the appliance to a power source, the electrical outlet comprising a power meter circuit configured to monitor power consumption of the appliance. The system further includes on or more computing devices configured to obtain a first set of data indicative of power consumption of the appliance during an interval of time via a power meter circuit associated with an electrical outlet configured to couple the appliance to a power source, determine a profile indicative of power consumption of the appliance based, at least in part, on the first set of data, and subsequent to determining the profile, obtain a second set of data indicative of power consumption of the appliance via the power meter circuit associated with the electrical outlet. The one or more computing devices are further configured to determine whether power consumption of the appliance deviates from the profile based, at least in part, on the second set of data and provide a notification indicative of power consumption of the appliance deviating from the profile.

Before any embodiments are explained in detail, it is to be understood that the embodiments are not limited in their application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software-based devices, as well as a plurality of different structural components, may be utilized to implement the embodiments. For example, "servers," "computing devices," "controllers," "processors," etc., described in the specification may include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value. As another example, the use of the term "about" in conjunction with a numerical value is intended to refer to within 20% of the stated amount. Also, use of the term "obtaining" or "obtain" may include receiving, determining, calculating, accessing, reading or otherwise obtaining data.

Functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way but may also be configured in ways that are not explicitly listed.

Other aspects of the disclosure will become apparent by consideration of the detailed description and accompanying drawings.

DETAILED DESCRIPTION

Figure 1:
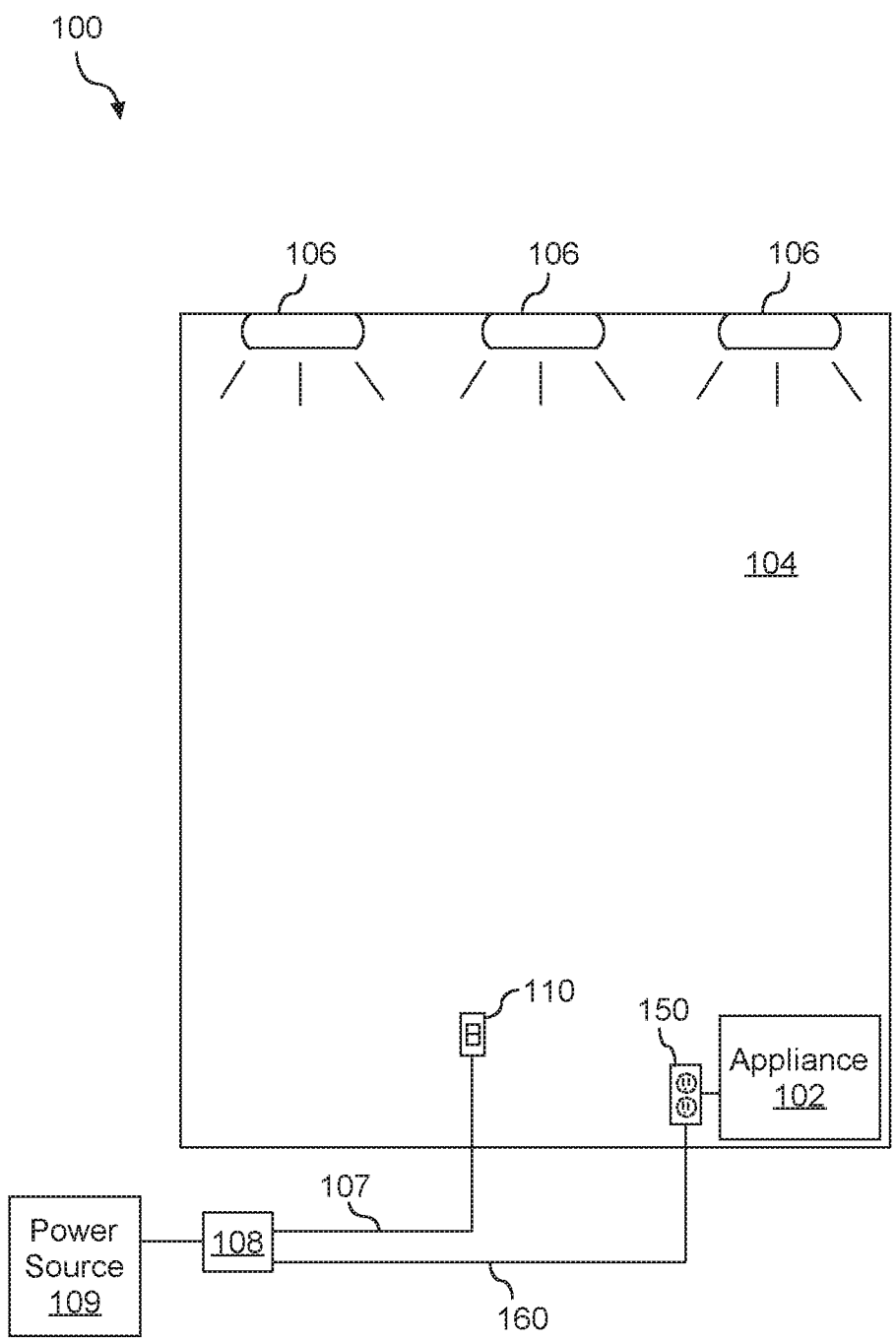
FIG. 1 is a schematic illustration of a system for monitoring operation of an appliance according to some embodiments.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations may be made to the embodiments without departing from the scope or spirit of the present disclosure. For instance, features illustrated or described as part of one embodiment may be used with another embodiment to yield a still further embodiment. Thus, it is intended that aspects of the present disclosure cover such modifications and variations.

Example aspects of the present disclosure are directed to a system for monitoring power consumption of an appliance within a space. The appliance may include any suitable type of electrical load configured to draw power from a power source (e.g., AC mains). For instance, in some implementations, the appliance may include any suitable type of household appliance (e.g., coffee machine, oven, refrigerator, freezer, washing machine, dryer, etc.). The system may include an electrical outlet or other in-wall device configured to electrically couple the appliance to the power source. In some implementations, the electrical outlet may include one or more receptacles configured to receive a plug of a power cord associated with the appliance. The electrical outlet or other in-wall device may include a power meter circuit. The power meter circuit may be configured to obtain data indicative of power consumption of the appliance. As will be discussed below in more detail, the system may include one or more computing devices configured to monitor power consumption of the appliance based, at least in part, on power consumption data obtained via the power meter circuit of the electrical outlet or other in-wall device.

The one or more computing devices may be configured to obtain, via the power meter circuit, a first set of data indicative of power consumption of the appliance during an interval of time. It should be appreciated that the interval time may correspond to any suitable amount of time. For instance, in some implementations, the interval of time may be about 1 day (e.g., 24 hours), 1 week (e.g., 168 hours), or any other suitable amount of time.

The one or more computing devices may be configured to determine a profile indicative of power consumption of the appliance based, at least in part, on the first set of data. The profile may indicate patterns of use of the appliance during the interval of time. For instance, in some implementations, the profile may indicate the appliance consumes more power at a particular time of day (e.g., morning, afternoon, evening).

The one or more computing devices may be configured to obtain, via the power meter circuit, a second set of data indicative of power consumption of the appliance subsequent to determining the profile. The one or more computing devices may be further configured to determine whether power consumption of the appliance deviates from the profile. For instance, the one or more computing devices may be configured to compare the second set of data against the first set of data used to determine the profile for the appliance. When the second set of data deviates from the first set of data by a predetermined amount, the one or more computing devices may be configured to determine power consumption of the appliance has deviated from the profile. As will be discussed below in more detail, the one or more computing devices may be configured to provide a notification indicative of power consumption of the appliance deviating from the profile.

In some implementations, the system may include a power switch configured to control power delivery to one or more electrical loads within the space. For instance, in some implementations, the one or more electrical loads may include one or lighting fixtures within the space. Alternatively and/or additionally, the one or more electrical loads may include one or more ceiling fans configured to circulate air within the space. The power switch may include a power meter circuit configured to monitor power consumption of the one or more electrical loads. Additionally, the power switch may include one or more microphones configured to detect audible noise. For instance, the one or more microphones may detect audible noise associated with one or more voice commands spoken by a user present within the space to toggle power to the one or more electrical loads.

In some implementations, the one or more computing devices may be configured to determine whether a person is present within the space in response to determining power consumption of the appliance deviates from the profile. For instance, the one or more computing devices may be configured to obtain a third set of data from the power switch. As will be discussed below, the third set of data may include power consumption data obtained via the power meter circuit of the power switch and/or audio data obtained via the one or more microphones of the power switch. It should be appreciated, however, that the third set of data may include any suitable type of data obtained via the power switch and indicative of whether a person is present within the space.

In some implementations, the power consumption data may indicate whether the one or more electrical loads are activated (e.g., turned on) or deactivated (e.g., turned off). For instance, when the power consumption data obtained from the power meter circuit of the power switch indicates the one or more lighting fixtures are activated (e.g., turned on) such that a light source thereof is illuminating the space, the power consumption data may indicate a person is present within the space. Conversely, the power consumption data may indicate a person is not present within the space when the power consumption data obtained via the power meter circuit of the power switch indicates the one or more lighting fixtures are deactivated (e.g., turned off) such that the light source thereof is not illuminating the space.

In some implementations, the one or computing device may be configured to determine whether a person is present within the space based, at least, in part, on audio data obtained via the one or more microphones of the power switch. For instance, the one or more computing devices may be configured to determine a person is present within the space when the audio data includes audible noise indicative of a person being present within the space. Examples of the audible noise may include, without limitation, one or more words (e.g., voice commands) spoken by the person, one or more audible gestures (e.g., laughing) made by the person, or any other suitable noise made by the person.

When the one or more computing devices determine a person is present within the space, the one or more computing devices may be configured to provide one or more control signals associated with controlling operation of the power switch to provide a notification (e.g., audible and/or visual) indicative of power consumption of the appliance deviating from the profile. For example, the one or more control signals may be associated with providing an audible notification over one or more speakers of the power switch. In this manner, the audible notification may be heard by the person present within the space and may prompt the person to take one or more actions to prevent damage to the appliance and/or the electrical outlet coupling the appliance to the power source. For instance, the audible notification may prompt the person to unplug the power cord of the appliance from the electrical outlet.

When the one or more computing devices determine no one is present within the space, the one or more computing devices may be configured to provide a notification indicative of power consumption of the appliance deviating from the profile to one or more user devices (e.g., smartphone, tablet, laptop, etc.) associated with one or more persons. For instance, the notification may include an audible notification (e.g., automated phone call, etc.) provided to the one or more user devices. Alternatively and/or additionally, the notification may include a visual notification (e.g., text message, email, etc.) provided to the one or more user devices. In this manner, one or more persons associated with the one or more user devices may be notified of power consumption of the appliance deviating from the profile. Furthermore, the notification may prompt the one or more persons to enter the space to take one or more actions to prevent damage to the appliance and/or the electrical outlet coupling the appliance to the power source. In particular, the notification may prompt the one or more persons to unplug a power cord associated with the appliance from the electrical outlet.

The system of the present disclosure provides numerous technical benefits. For instance, data (e.g., power consumption data and/or audio data) obtained from the power switch may allow the system to determine whether a person is present within the space and provide a local notification via the power switch to notify the person that power consumption of the appliance has deviated from the profile. In this manner, the notification may prompt the person to take action to prevent damage to the appliance and/or the electrical outlet coupling the appliance to the power source.

Referring now to the Figures, FIG. 1 illustrates a system 100 for monitoring power consumption of an appliance 102 within a space 104 according to example embodiments of the present disclosure. As shown, the system 100 includes a power switch 110 configured to control power delivery to one or more lighting fixtures 106 (e.g., luminaires) within the space 104. In this manner, lighting within the space 104 may be controlled by the power switch 110. It should be appreciated, however, that the power switch 110 may be configured to control power delivery to any suitable load. For instance, in some implementations, the power switch 110 is configured to control power delivery to one or more ceiling fans in the space 104.

In some implementations, the power switch 110 is coupled to an electrical panel 108 including one or more circuit breakers. More specifically, the power switch 110 may be coupled to the electrical panel 108 via one or more conductors 107. In some implementations, the electrical panel 108 is coupled to a power source 109 (e.g., AC mains). In this manner, electrical power is provided from the power source 109 to the power switch 110 via the electrical panel 108.

As shown, the system 100 further includes an in-wall device, or electrical outlet, 150. The electrical outlet 150 is coupled to the electrical panel 108 via one or more conductors 160 (e.g., wires) and may include one or more receptacles. In this manner, a plug of a power cord associated with the appliance 102 may be plugged into one of the receptacles to couple the appliance 102 to the power source 109. It should be appreciated that, in some implementations, the appliance 102 and the one or more lighting fixtures 106 may be on separate circuits. For instance, the one or more lighting fixtures 106 may be coupled to a first circuit breaker associated with the electrical panel 108, whereas the appliance 102 may be coupled to a second circuit breaker associated with the electrical panel 108 that is different than the first circuit breaker.

Figure 2:
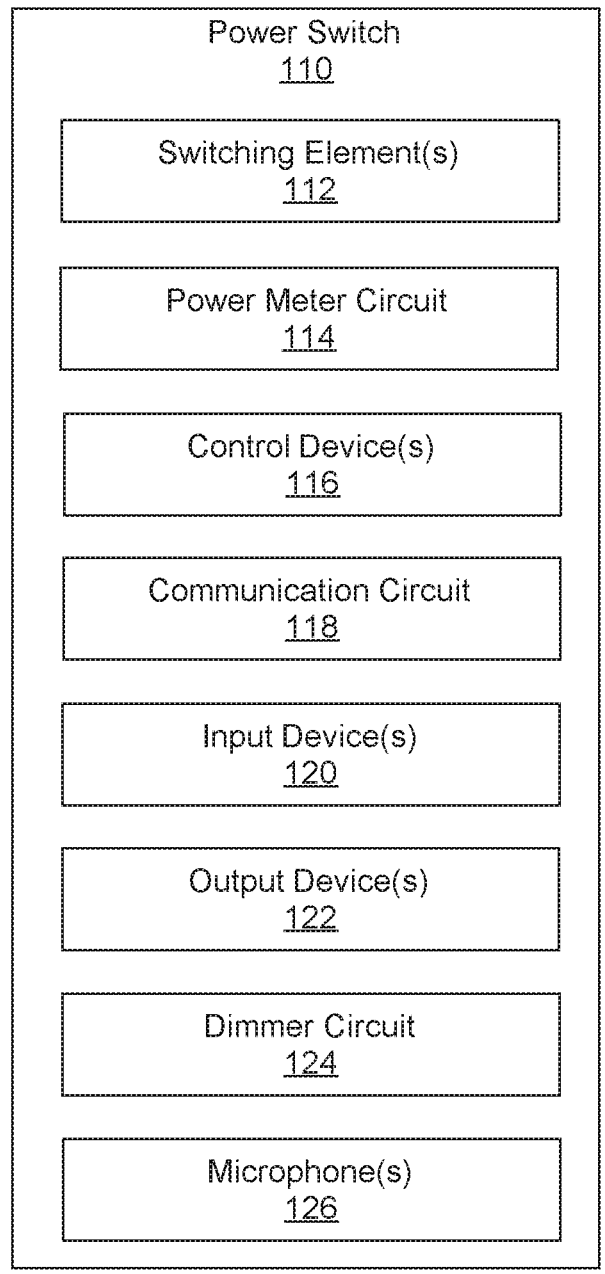
FIG. 2 illustrates a block diagram of a power switch included in the system of FIG. 1 according to embodiments.

FIG. 2 illustrates suitable components of the power switch 110 according to example embodiments of the present disclosure. As shown, the power switch 110 includes one or more switching elements 112 configured to selectively couple the one or more lighting fixtures 106 (FIG. 1) to the power source 109. In some implementations, the one or more switching elements 112 are configurable in at least a first state and a second state. When the one or more switching elements 112 are configured in the first state, power is delivered from the power source to the one or more lighting fixtures (FIG. 1). In contrast, power is not delivered from the power source to the one or more lighting fixtures 106 (FIG. 1) when the one or more switching elements 112 are in the second configuration. It should be appreciated that the one or more switching elements 112 may include any suitable device configured to control power delivery to the load. For instance, in some implementations, the one or more switching elements 112 may include one or more contactors. Alternatively, the one or more switching elements 112 may include one or more transistors, one or more silicon controlled rectifier (SCR), one or more TRIACs, or any other suitable device configured to control power delivery to the load (e.g., lighting fixture).

In some implementations, the power switch 110 includes a power meter circuit 114. The power meter circuit 114 is configured to detect (e.g., measure) power consumption of the one or more lighting fixtures 106 (FIG. 1) selectively coupled to the power source 109 via the one or more switching elements 112. It should be appreciated that the power meter circuit 114 may include any suitable electrical components. For instance, in some implementations, the power meter circuit 114 may include one or more voltage sensors and/or one or more current sensors.

In some implementations, the power switch 110 includes one or more control devices 116. The one or more control devices 116 are configured to control power delivery to the one or more lighting fixtures 106 (FIG. 1). In particular, the one or more control devices 116 may be configured to control operation of the one or more switching elements 112 to selectively couple the one or more lighting fixtures 106 to the power source 109.

In some implementations, the power switch 110 includes a communication circuit 118. The communication circuit 118 may include associated electronic circuitry that may be used to communicatively couple the one or more control devices 116 with other devices, such as one or more control devices associated with a user device (e.g., smartphone, tablet, laptop, etc.). In some implementations, the communication circuit 118 allows the one or more control devices 116 to communicate directly with the other devices. In other implementations, the communication circuit 118 provides for communication with the other devices over a network.

The network may be any suitable type of network, such as a Power-Over-Ethernet (POE) network, a local area network (e.g., intranet), a wide area network (e.g., internet), a low power wireless network (e.g., Bluetooth Low Energy (BLE), Zigbee, etc.), or some combination thereof and may include any number of wired or wireless links. In general, communication over the network may be implemented via any type of wired or wireless connection, using a wide variety of communication protocols, encodings or formats, and/or protection schemes.

Example communication technologies used in accordance with example aspects of the present disclosure may include, for instance, Bluetooth low energy, Bluetooth mesh networking, near-field communication, Thread, TLS (Transport Layer Security), Wi-Fi (e.g., IEEE, 802.11), Wi-Fi Direct (for peer-to-peer communication), Z-Wave, Zigbee, Halow, cellular communication, LTE, low-power wide area networking, VSAT, Ethernet, MoCA (Multimedia over Coax Alliance), PLC (Power-line communication), DLT (digital line transmission), Power over Ethernet, etc. Other suitable wired and/or wireless communication technologies may be used without deviating from the scope of the present disclosure.

In some implementations, the power switch 110 includes one or more input devices 120 communicatively coupled with the one or more control devices 116. In some implementations, the one or more input devices 120 may include, without limitation, a press-button, a rocker switch, a paddle switch, or a rocker switch. It should be appreciated, however, that the one or more input devices 120 may include any suitable type of input device. In some implementations, the one or more input devices 120 may be manipulated to selectively couple the one or more lighting fixtures 106 (FIG. 1) to the power source 109 (FIG. 1). Alternatively or additionally, the one or more lighting fixtures 106 (FIG. 1) may include a dimmable light source, and the one or more input devices 120 may be manipulated to dim or brighten the dimmable light source.

In some implementations, the power switch 110 includes one or more output devices 122 communicatively coupled with the one or more control devices 116. For instance, the one or more output devices 122 may include one or more speakers configured to emit audible noise. Alternatively or additionally, the one or more output devices 122 may include one or more indicator lights (e.g., LED indicator lights).

Figure 3:
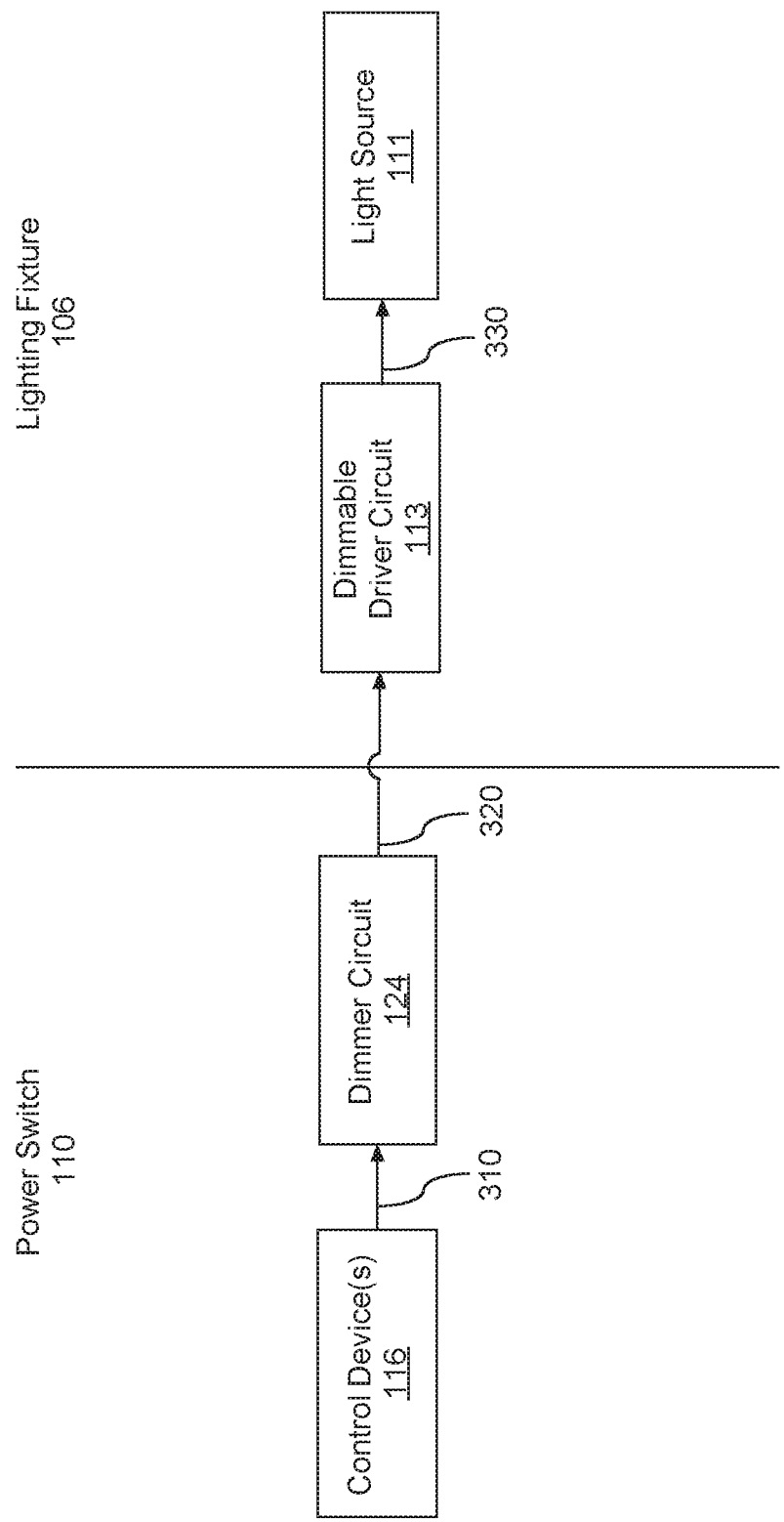
FIG. 3 illustrates an exemplary lighting fixture used in conjunction with a power switch according to some embodiments.

In some implementations, the power switch 110 includes a dimmer circuit 124. In some implementations, the power switch 110 may include a dimmer circuit 124. Referring briefly now to FIG. 3, the dimmer circuit 124 is communicatively coupled with the one or more control devices 116 of the power switch 110. In some implementations, the dimmer circuit 124 is configured to receive a control signal 310 from the one or more control devices 116. The control signal 310 may be associated with dimming or brightening a light source 111 of the one or more lighting fixtures 106. It should be appreciated that the light source 111 may include any suitable type of light source. For instance, in some implementations, the light source 111 may include a light emitting diode (LED) device.

The dimmer circuit 124 may be configured to output a dimming control signal 320 based, at least in part, on the control signal 310. The dimming control signal 320 may be, for instance, a 0V to 10V signal. As used herein, a 0V to 10V dimming control signal may vary from, for instance, 1V to 9V, 1V to 10V, 2V to 8V, 2V to 9V, 2V, to 10V, 1V to 11V, or other suitable range between about 0V and about 10V. Other suitable protocols may be used for the dimming control signal 320. For instance, the dimming control signal 320 may be a digital addressable lighting interface (DALI) dimming control signal, digital multiplex (DMX) dimming control signal, or other dimming control signal.

As shown, the one or more lighting fixtures 106 include a driver circuit 113. The driver circuit 113 may be configured to receive an input power, such as an input AC power or an input DC power, from a power source. The driver circuit 113 may be further configured to convert the input power to a suitable driver current 330 for powering a load, such as the light source 111 of the one or more lighting fixtures 106. In some embodiments, the driver circuit 113 may include various components, such as switching elements (e.g. transistors) that are controlled to provide the suitable driver current 330. For instance, in one embodiment, the driver circuit 113 includes one or more transistors. Gate timing commands may be provided to the one or more transistors to convert the input power to a suitable driver current using pulse width modulation techniques. In other instances, the driver circuit 113 may be a direct drive AC circuit with full bridge rectification wherein the driver current 330 is a constant $I_{rms}$ current.

In some implementations, the driver circuit 113 is a dimmable driver circuit. For instance, the driver circuit 113 may receive the dimming control signal 320 from the dimmer circuit 124 of the power switch 110. In this manner, the driver circuit 113 may control the driver current 330 based, at least in part, on the dimming control signal 320. For example, reducing the dimming control signal 320 by about 50 percent results in a corresponding reduction in the driver current 330 of about 50 percent. The reduction of the driver current 330 for supply to the one or more lighting fixtures 106 (FIG. 1) results in the radiant flux of one or more light sources 111 of the one or more lighting fixtures 106 being decreased In some implementations, the power switch 110 includes one or more microphones 126. The one or microphones 126 may be configured to detect audible noise within the space 104 (FIG. 1). For instance, the one or more microphones 126 may be configured to detect audible noise made by a person within the space 104. In this manner, the power switch 110 may detect presence of a person within the space 104 based, at least in part, on audio data obtained via the one or more microphones 126 thereof.

Figure 4:
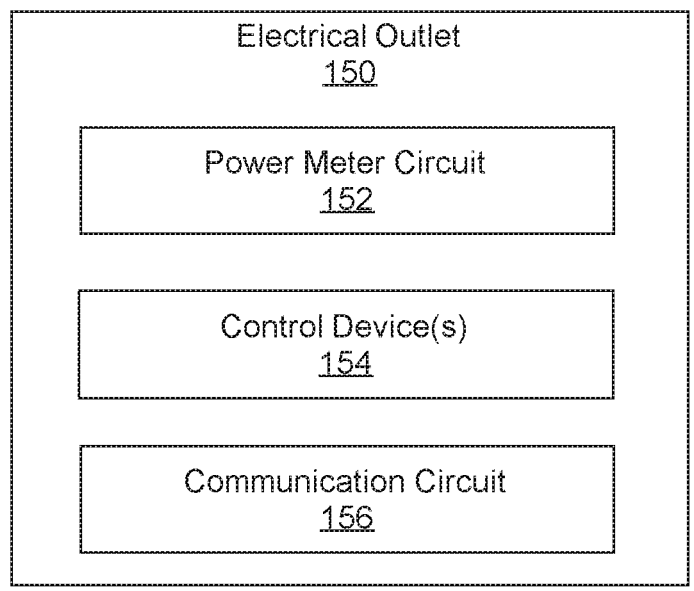
FIG. 4 illustrates a block diagram of an electrical outlet included in the system of FIG. 1 according to some embodiments.

Referring now to FIG. 4, components of the electrical outlet 150 are provided according to example embodiments of the present disclosure. As shown, the electrical outlet 150 includes a power meter circuit 152. The power meter circuit 152 may be configured to detect (e.g., measure) power consumption of the appliance 102 (FIG. 1) that is coupled to the power source 109 via the electrical outlet 150. It should be appreciated that the power meter circuit 152 may include any suitable electrical components. For instance, in some implementations, the power meter circuit 152 may include one or more voltage sensors and/or one or more current sensors.

In some implementations, the electrical outlet 150 includes one or more control devices 154. The one or more control devices 154 may be configured to control operation of the power meter circuit 152. In particular, the one or more control devices 154 may be configured to obtain data indicative of power consumption of the appliance 102 (FIG. 1) via the power meter circuit 152.

In some implementations, the electrical outlet 150 includes a communication circuit 156. The communication circuit 156 may include associated electronic circuitry that may be used to communicatively couple the one or more control devices 154 with the other devices such as one or more control devices associated with a user device (e.g., smartphone, tablet, laptop, etc.). In some implementations, the communication circuit 156 may allow the one or more control devices 154 to communicate directly with the other devices. In other implementations, the communication circuit 156 may provide for communication with the other devices over a network.

Figure 5:
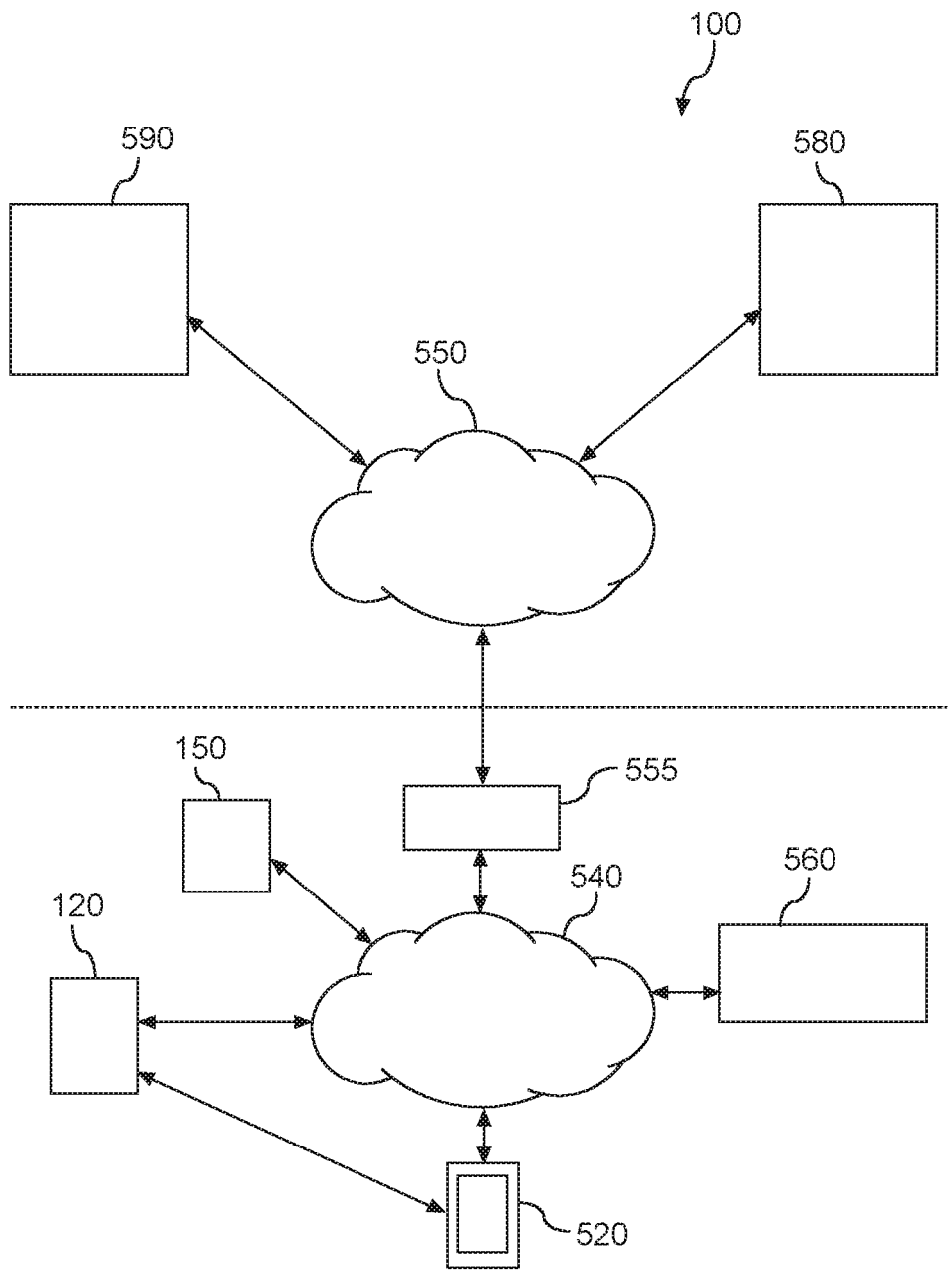
FIG. 5 is a schematic illustration of a system for monitoring power consumption of an appliance according to some embodiments.

Referring now to FIG. 5, the power switch 110 and/or the electrical outlet 150 are in communication with user devices 520, 560. For instance, user devices 520, 560 may include one or more smartphones, laptops, desktops, tablets, wearable devices, media devices, displays with one or more processors, or other suitable devices. In some implementations, the power switch 110 and/or electrical outlet 150 are in communication with the user devices 520, 560 via a direct communication link (e.g., direct wired or wireless communication link) or via a network, such as local area network 540. The direct communication link may be implemented, for instance, using Bluetooth low energy or other suitable communication protocol. In some implementations, a user may control, view information, and/or specify one or more settings associated with the power switch 110 and/or the electrical outlet 150 via a graphical user interface implemented on a display of the user device 520, 560. For instance, a user may access an application implemented on the user device 520. The application may present a graphical user interface on a display of the user device 520, 560. In this manner, a user may interact with the graphical user interface to control operation of the power switch 110 and/or the electrical outlet 150.

The local area network 540 may be any suitable type of network or combination of networks that allows for communication between devices. In some embodiments, the network(s) may include one or more of a secure network, Wi-Fi network, IoT network, mesh network, one or more peer-to-peer communication links, and/or some combination thereof, and may include any number of wired or wireless links. Communication over the local area network 540 may be accomplished, for instance, via a communication interface using any type of protocol, protection scheme, encoding, format, packaging, etc.

As shown, the system 100 may further include a gateway 555 that allows access to a wide area network 550. The wide area network 550 may be, for instance, the Internet, cellular network, or other network, and may include any number of wired or wireless links Communication over the wide area network 550 may be accomplished, for instance, via a communication interface using any type of protocol, protection scheme, encoding, format, packaging, etc. As shown, the connected devices 502 may communicate information over the wide area network 550 to remote computing system 580 and 590 and other remote computing devices of the system 100 via the gateway 555.

In some implementations, power consumption data collected via the electrical outlet 150 is communicated to the remote computing system 580. In particular, a first set of data obtained via the power meter circuit 152 (FIG. 4) of the electrical outlet 150 during an interval of time (e.g., 24 hours) may be communicated to the remote computing system 580. The first set of data may be indicative of power consumption of the appliance 102 (FIG. 1) during the interval of time. The remote computing system 580 is configured to process the first set of data to determine a profile indicative of power consumption of the appliance 102 (FIG. 1). Furthermore, a second set of data obtained via the power meter circuit 152 (FIG. 4) of the electrical outlet 150 may be communicated to the remote computing system 580 subsequent to the remote computing system 580 determining the profile indicative of power consumption of the appliance 102. The remote computing system 580 is configured to process the second set of data to determine whether power consumption of the appliance 102 deviates from the profile determined based, at least in part, on the first set of data. In particular, the remote computing system 580 may be configured to compare the second set of data against the first set of data. When the second set of data deviates from the first set of data by a threshold amount, the remote computing system 580 is configured to determine power consumption of the appliance 102 has deviated from the profile indicative of power consumption of the appliance 102. As will be discussed below, a notification indicative of power consumption of the appliance 102 deviating from the profile may be provided to notify a person of the event. In this manner, the person may be prompted to take one or more actions to prevent damage to the appliance 102 and/or the electrical outlet 150 due, at least in part, to the appliance 102 deviating from the profile indicative of power consumption of the appliance 102.

In some implementations, the remote computing system 580 may obtain a third set of data from the power switch 110 in response to determining power consumption of the appliance 102 has deviated from the profile. For example, the third set of data may include power consumption data obtained via the power meter circuit 114 (FIG. 2) of the power switch 110. In particular, the power consumption data may indicate whether the one or more lighting fixtures 106 (FIG. 1) within the space 104 are activated (e.g., turned on) or deactivated (e.g., turned off). In this manner, the remote computing system 580 may determine whether a person is present within the space 104 based, at least in part, on the power consumption data obtained via the power meter circuit 114 of the power switch 110.

Alternatively and/or additionally, the third set of data may include audio data obtained via the one or more microphones 126 (FIG. 2) of the power switch 110. In particular, the audio data may be indicative of audible noise made by a person present within the space 104. In some implementations, the audio data may be indicative of one or more voice commands spoken by the person. For example, the one or more voice commands may be associated with toggling power to the one or more lighting fixtures 106 (FIG. 1). More specifically, the one or more voice commands may be associated with coupling the light source 111 (FIG. 3) of the one or more lighting fixtures 106 to the power source 109 (FIG. 1) such that the light source 111 illuminates the space 104. Alternatively, the one or more voice commands may be associated with decoupling the light source 111 from the power source 109 such that the light source 111 does not illuminate the space 104 in which the one or more lighting fixtures 106 are located.

In some implementations, the remote computing system 580 may be configured to process the audio data to determine the one or more voice commands. Furthermore, the remote computing system 580 may be configured to determine one or more actions associated with controlling operation of the power switch 110 according to the one or more voice commands. In this manner, the remote computing system 580 may be configured to implement a digital assistant service associated with the power switch 110. In alternative implementations, the remote computing system 580 may communicate the audio data to remote computing system 590, which may be configured to process the audio data and implement the digital assistant service associated with the power switch 110.

When the remote computing system 580 determines a person is present within the space 104 based, at least in part, on the third set of data (e.g., power consumption data and/or audio data), the remote computing system 580 is configured to provide a notification to the person. In particular, the notification may be indicative of power consumption of the appliance 102 deviating from the profile. For instance, in some implementations, the notification is an audible notification provided via the one or more output devices 122 (FIG. 2) of the power switch 110. In some implementations, the remote computing system 580 is further configured to provide a notification (e.g., audible and/or visual) to user devices 520, 560. In this manner, the notification is provided to a user device associated with the person. Alternatively and/or additionally, the notification may be provided to user devices 520, 560 associated with persons that are not present within the space 104.

When the remote computing system 580 determines a person is not present within the space 104 based, at least in part, on the third set of data (e.g., power consumption data and/or audio data), the remote computing system 580 is configured to provide a notification (e.g., audible and/or visual) to user devices 520, 560 associated with one or more persons. For instance, the notification may include a visual notification (e.g., text message, email, etc.) indicative of power consumption of the appliance 102 deviating from the profile. Alternatively and/or additionally, the notification may include an audible notification (e.g., automated phone call) indicative of power consumption of the appliance 102 deviating from the profile.

The remote computing system 580 and 590 may include one or more computing devices. The one or more computing devices may include one or more processors and one or more memory devices. The remote computing systems 580 and 590 may be distributed such that its components are located in different geographic areas. The technology discussed herein refers to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein may be implemented using a single computing device or multiple computing devices working in combination. Databases, memory, instructions, and applications may be implemented on a single system or distributed across multiple systems. Distributed components may operate sequentially or in parallel.

Although the remote computing system 580 and 590 are depicted as being remote relative to the power switch 110, it should be appreciated that, in some implementations, the remote computing system 580 and 590 may be implemented locally at the power switch 110. Stated another way, the remote computing system 580 and 590 may be included as part of the power switch 110. In such implementations, the electrical outlet 150 may be configured to communicate power consumption data (e.g., first set of data and second set of data) to the power switch 110 via the local area network 540.

Figure 6:
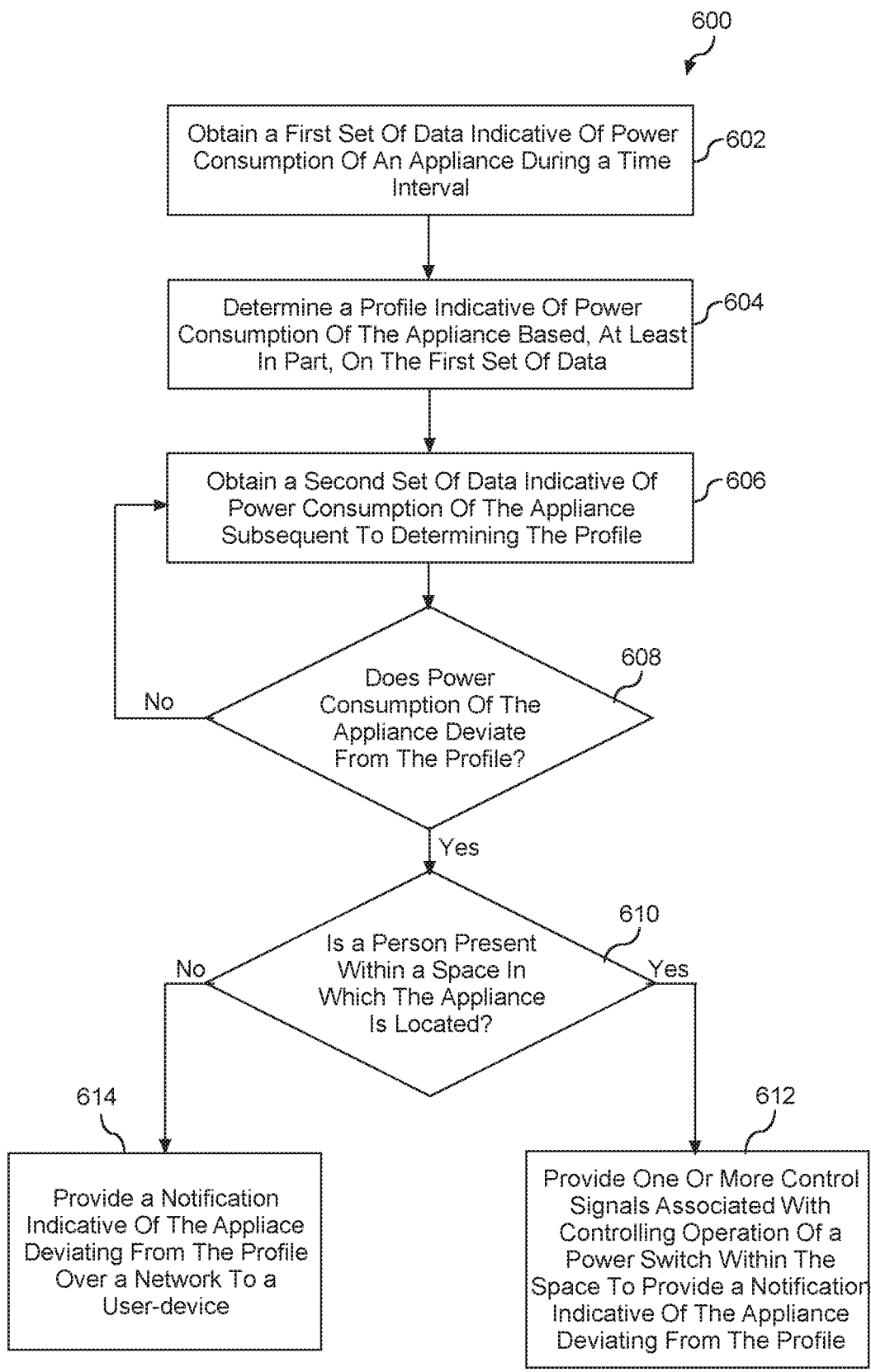
FIG. 6 is a flow chart illustrating a process or operation for monitoring power consumption of an appliance according to some embodiments of the present disclosure.

FIG. 6 illustrates a flowchart illustrating a process or a method 600 for monitoring power consumption of an appliance located within a space is provided according to example embodiments of the present disclosure. It should be appreciated that the method 600 may be implemented using the system 100 discussed above with reference to FIGS. 1-5. FIG. 6 depicts steps performed in a particular order for purposes of illustration and discussion. Those of ordinary skill in the art, using the disclosures provided herein, will understand that various steps of the method 600 may be adapted, modified, rearranged, performed simultaneously or modified in various ways without deviating from the scope of the present disclosure.

At (602), the method 600 includes obtaining, by one or more computing devices, a first set of data indicative of power consumption of the appliance during an interval of time from a power meter circuit associated with an electrical outlet configured to couple the appliance to a power source. In this manner, the power meter circuit may obtain data indicative of power consumption of the appliance when a plug of a power cord associated with the appliance is plugged into the electrical outlet. It should be appreciated that the interval time may correspond to any suitable amount of time. For instance, in some implementations, the interval of time may be about 1 day (e.g., 24 hours), 1 week (e.g., 168 hours), or any other suitable amount of time.

At (604), the method 600 includes determining, by the one or more computing devices, a profile indicative of power consumption of the appliance based, at least in part, on the first set of data obtained at (602). The profile may indicate patterns of use of the appliance over the interval of time. For instance, in some implementations, the profile may indicate the appliance consumes more power at a particular time (e.g., morning, afternoon, evening, etc.). As will be discussed below, data indicative of power consumption of the appliance may be obtained subsequent to determining the profile and compared against the profile to determine whether power consumption of the appliance deviates from the profile.

At (606), the method 600 includes obtaining, by the one or more computing devices, a second set of data indicative of power consumption of the appliance from the power meter circuit of the electrical outlet. In this manner, the power meter circuit of the electrical outlet may obtain data (e.g., second set of data) indicative of power consumption of the appliance when a plug of a power cord associated with the appliance is plugged into the electrical outlet.

At (608), the method 600 includes determining, by the one or more computing devices, whether power consumption of the appliance deviates from the profile determined at (604). In particular, the one or more computing devices are configured to compare the second set of data obtained at (606) to the profile to determine whether power consumption of the appliance deviates from the profile. For instance, in some implementations, the second set of data may indicate that the appliance is consuming a greater amount of power at a particular time of day compared to the amount of power the appliance was consuming at that same time of day when the first set of data indicative of power consumption was obtained at (602). In particular, the one or more computing devices may be configured to determine power consumption of the appliance deviates from the profile when the second set of data indicates power consumption deviates from the first set of data by a threshold amount. In this manner, the one or more computing devices may be configured to ignore instances in which the second set of data deviates from the first set of data by less than the threshold amount. However, when the second set of data deviates from the first set of data by the threshold amount, the method 600 proceeds to (610). Otherwise, the method reverts to (606).

At (610), the method 600 includes determining, by the one or more computing devices, whether a person is present within the space in which the appliance is located. In some implementations, determining whether the person is present within the space may include obtaining a third set of data from a power switch configured to control power deliver to one or more lighting fixtures within the space.

In some implementations, the third set of data may include power consumption data obtained via a power meter circuit of the power switch. It should be understood that the power consumption data may indicate whether the one or more light fixtures are activated (e.g., turned on) or deactivated (e.g., turned off). For instance, when the power consumption data indicates the one or more lighting fixtures are activated (e.g., turned on) such that a light source thereof is illuminating the space, the power consumption data may indicate a person is present within the space. Conversely, the power consumption data may indicate a person is not present within the space when the power consumption data indicates the one or more lighting fixtures are deactivated (e.g., turned off) such that the light source thereof is not illuminating the space.

In some implementations, the third set of data may include audio data obtained via one or more microphones of the power switch. For instance, the one or more computing devices may be configured to determine a person is present within the space when the audio data includes audible noise indicative of a person being present within the space. Examples of the audible noise may include, without limitation, one or more words spoken by the person, one or more audible gestures (e.g., laughing) made by the person, or any other suitable noise made by the person. When the one or more computing devices determine a person is present within the space, the method 600 proceeds to (612). Otherwise, the method 600 proceeds to (614).

At (612), the method 600 includes providing, by the one or more computing devices, one or more control signals associated with controlling operation of the power switch to provide a notification (e.g., audible and/or visual) indicative of power consumption of the appliance deviating from the profile. For example, the one or more control signals may be associated with providing an audible notification over the one or more speakers of the power switch. In this manner, the audible notification may be heard by the person present within the space may prompt the person to take one or more actions to prevent damage to the appliance and/or the electrical outlet coupling the appliance to the power source. For instance, the audible notification may prompt the person to unplug the power cord of the appliance from the electrical outlet.

At (614), the method 600 includes providing, by the one or more computing devices, a notification indicative of power consumption of the appliance deviating from the profile to one or more user devices (e.g., smartphone, tablet, laptop, etc.). For instance, the notification may include an audible notification (e.g., automated phone call, etc.) provided to the one or more user devices. Alternatively and/or additionally, the notification may include a visual notification (e.g., text message, email, etc.) provided to the one or more user devices. In this manner, one or more persons that are remote relative to the space may be notified of power consumption of the appliance deviating from the profile. Furthermore, the notification may prompt the one or more persons to enter the space to take one or more actions to prevent damage to the appliance and/or the electrical outlet coupling the appliance to the power source. In particular, the notification may prompt the one or more persons to unplug a power cord associated with the appliance from the electrical outlet.

Figure 7:
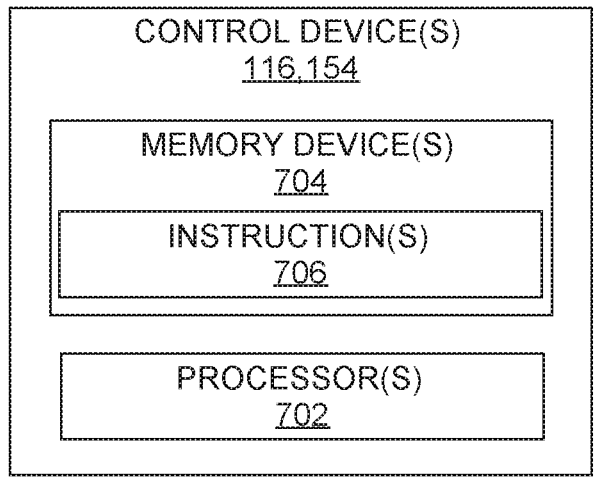
FIG. 7 depicts is block diagram of a control device according to some embodiments.

FIG. 7 illustrates one embodiment of suitable components of the one or more control devices 116, 154. As shown, the one or more control devices 116, 154 include one or more processors 702 configured to perform a variety of computer-implemented functions (e.g., performing the methods, steps, calculations and the like disclosed herein). As used herein, the term "processor" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits.

As shown, the one or more control devices 116, 154 may include a memory device 704. Examples of the memory device 704 may include computer-readable media including, but not limited to, non-transitory computer-readable media, such as RAM, ROM, hard drives, flash drives, or other suitable memory devices. The memory device 704 may store information accessible by the one or more processors 702, including computer-readable instructions 706 that may be executed by the one or more processors 702. The computer-readable instructions 706 may be any set of instructions that, when executed by the one or more processors 702, cause the one or more processors 702 to perform operations. The computer-readable instructions 706 may be software written in any suitable programming language or may be implemented in hardware.

In some implementations, the computer-readable instructions 706 may be executed by the one or more processors 702 to perform operations, such as controlling power delivery to one or more loads. For instance, controlling power delivery to the one or more loads may include controlling operation of the one or more switching elements 210 to selectively couple the one or more loads to the power source (not shown).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for monitoring power consumption of an appliance within a space, the method comprising:
obtaining, by one or more computing devices, a first set of data indicative of power consumption of the appliance during an interval of time from a power meter circuit associated with an electrical outlet configured to couple the appliance to a power source;
determining, by one or more computing devices, a profile indicative of power consumption of the appliance based, at least in part, on the first set of data;
subsequent to determining the profile, obtaining, by the one or more computing devices, a second set of data indicative of power consumption of the appliance from the power meter circuit associated with the electrical outlet;
determining, by the one or more computing devices, whether power consumption of the appliance deviates from the profile based, at least in part, on the second set of data;
responsive to determining power consumption of the appliance deviates from the profile, determining, by the one or more computing devices, whether a person is present within the space;
responsive to determining power consumption of the appliance deviates from the profile and responsive to determining the person is present within the space, providing, by the one or more computing devices, a notification indicative of power consumption of the appliance deviating from the profile;
wherein determining whether the person is present within the space includes obtaining, by the one or more computing devices, a third set of data indicative of presence of the person within the space via a power switch configured to control power delivery to one or more light sources configured to illuminate the space and determining, by the one or more computing devices, whether the person is present within the space based, at least in part, on the third set of data.

2. The method of claim 1, wherein the third set of data comprises audio data obtained via one or more microphones of the power switch.

3. The method of claim 1, wherein the third set of data comprises data indicative of power consumption of the one or more light sources.

4. The method of claim 1, further comprising:
responsive to determining the person is present within the space, providing, by the one or more computing devices, one or more control signals associated with controlling operation of the power switch to provide the notification.

5. The method of claim 4, wherein the one or more control signals are associated with providing the notification via one or more output devices of the power switch.

6. The method of claim 5, wherein the one or more output devices comprise one or more speakers.

7. The method of claim 1, further comprising:
responsive to determining the person is not present within the space, providing, by the one or more computing devices, the notification to a user device associated with one or more persons that are remote relative to the space.

8. The method of claim 7, wherein the notification comprises at least one of an audible notification and a visual notification.

9. The method of claim 1, wherein determining whether power consumption of the appliance deviates from the profile comprises:
comparing, by the one or more computing devices, the second set of data against the first set of data; and
determining, by the one or more computing devices, power consumption of the appliance deviates from the profile when the second set of data deviates from the first set of data by a threshold amount.

10. A system for monitoring operation of an appliance within a space, the system comprising:
a power switch configured to control power delivery to one or more electrical loads within a space, the power switch comprising one or more microphones;
an electrical outlet configured to couple the appliance to a power source, the electrical outlet comprising a power meter circuit configured to monitor power consumption of the appliance; and
one or more computing devices configured to:
obtain a first set of data indicative of power consumption of the appliance during an interval of time via a power meter circuit associated with an electrical outlet configured to couple the appliance to a power source;
determine a profile indicative of power consumption of the appliance based, at least in part, on the first set of data;
subsequent to determining the profile, obtain a second set of data indicative of power consumption of the appliance via the power meter circuit associated with the electrical outlet;
determine whether power consumption of the appliance deviates from the profile based, at least in part, on the second set of data;
determine whether a person is present within the space in response to determining power consumption of the appliance deviates from the profile; and
responsive to determining power consumption of the appliance deviates from the profile and responsive to determining the person is present within the space, provide a notification indicative of power consumption of the appliance deviating from the profile,
wherein determining whether the person is present within the space includes obtaining, by the one or more computing devices, a third set of data indicative of presence of the person within the space via a power switch configured to control power delivery to one or more light sources configured to illuminate the space and determining, by the one or more computing devices, whether the person is present within the space based, at least in part, on the third set of data.

11. The system of claim 10, wherein the third set of data comprises audio data obtained via one or more microphones of the power switch.

12. The system of claim 10, wherein the third set of data comprises data indicative of power consumption of the one or more electrical loads.

13. The system of claim 12, wherein the one or more electrical loads comprise one or more lighting fixtures.

14. The system of claim 13, wherein the one or more electrical loads comprise one or more ceiling fans.

15. The system of claim 10, wherein the one or computing devices are further configured to:
provide one or more control signals associated with controlling operation of the power switch to provide the notification in response to determining the person is present within the space.

16. The system of claim 15, wherein the one or more control signals are associated with providing the notification via one or more output devices of the power switch.

17. The system of claim 16, wherein the one or more output devices comprise one or more speakers.

18. The system of claim 10, wherein the one or more computing devices are further configured to:
provide the notification to a user device associated with one or more persons that are remote relative to the space in response to determining the person is not present within the space.

* * * * *